(12) United States Patent
Saitou

(10) Patent No.: US 8,298,346 B2
(45) Date of Patent: Oct. 30, 2012

(54) SUBSTRATE PROCESSING METHOD AND SUBSTRATE PROCESSING APPARATUS

(75) Inventor: Shunsuke Saitou, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 298 days.

(21) Appl. No.: 12/466,744

(22) Filed: May 15, 2009

(65) Prior Publication Data

US 2009/0283114 A1 Nov. 19, 2009

(30) Foreign Application Priority Data

May 15, 2008 (JP) .................. 2008-127981

(51) Int. Cl.
*B08B 3/00* (2006.01)
(52) U.S. Cl. ................ 134/26; 134/28; 134/30; 134/36
(58) Field of Classification Search .................... 134/26, 134/28, 30, 36
See application file for complete search history.

(56) References Cited

U.S. PATENT DOCUMENTS

2007/0087456 A1* 4/2007 Hashizume ............... 438/6

FOREIGN PATENT DOCUMENTS

| JP | 2001-156049 | | 6/2001 |
|---|---|---|---|
| JP | 2002-110605 | | 4/2002 |
| JP | 2004-096055 | | 3/2004 |
| JP | 2004-327537 | | 11/2004 |
| JP | 2007-134689 | | 5/2007 |
| JP | 2007-234813 | | 9/2007 |
| JP | 2007234813 A | * | 9/2007 |

OTHER PUBLICATIONS

Machine English Translation JP 2007-234813.*
Notification of Reasons for Refusal mailed Jun. 8, 2012 by the Japanese Patent Office in corresponding Japanese Application No. 2008-127981 with translation, 5 pages.

* cited by examiner

*Primary Examiner* — Michael Kornakov
*Assistant Examiner* — Nicole Blan
(74) *Attorney, Agent, or Firm* — Young & Thompson

(57) ABSTRACT

A substrate processing method includes: supplying a fluid to a resist on a substrate after an ion implantation in which the resist is used as a mask; and supplying a stripping liquid to the resist for stripping the resist after the supplying the fluid. A cured layer is formed in a surface of the resist in the ion implantation. The fluid is purified water or a mixed fluid of purified water and an inert gas. A volume flow rate of the purified water is not less than $1/400$ of a volume flow rate of the inert gas when the mixed fluid is supplied as the fluid.

10 Claims, 6 Drawing Sheets

Fig. 6

| SUPPLY TIME OF STRIPPING LIQUID \ SUPPLY TIME OF PURIFIED WATER | 300sec | 200sec | 120sec | 80sec | 40sec | 0sec |
|---|---|---|---|---|---|---|
| 528sec | ○ | ○ | ○ | ○ | ○ | × |
| 228sec | ○ | ○ | ○ | ○ | ○ | × |
| 168sec | ○ | ○ | ○ | ○ | ○ | × |
| 108sec | × | × | × | × | × | × |

Fig. 7

| SUPPLY TIME OF STRIPPING LIQUID \ SUPPLY TIME OF PURIFIED WATER | 300sec | 200sec | 120sec | 80sec | 40sec | 0sec |
|---|---|---|---|---|---|---|
| 528sec | ○ | ○ | ○ | ○ | ○ | × |
| 228sec | ○ | ○ | ○ | ○ | ○ | × |
| 168sec | ○ | ○ | × | × | × | × |
| 108sec | × | × | × | × | × | × |

SUBSTRATE PROCESSING METHOD AND SUBSTRATE PROCESSING APPARATUS

This application is based upon and claims the benefit of priority from Japanese patent application No. 2008-127981, filed on May 15, 2008, the disclosure of which is incorporated herein in its entirely by reference.

BACKGROUND OF THE INVENTION

1. Field of the Invention

The present invention relates to a substrate processing method and a substrate processing apparatus, and especially relates to a substrate processing method and a substrate processing apparatus for stripping from a substrate a resist used as a mask for an ion implantation.

2. Description of Related Art

In a manufacturing process of a semiconductor device, impurities (ions) may be implanted into a specific region of a surface of a substrate such as a semiconductor wafer. For example, phosphorus ions, arsenic ions, and boron ions are used as the impurities. A resist is provided on the substrate to implant ions only into a desired region of the substrate. The resist is formed of photosensitive resin, for example. A region other than the desired region is masked by the resist. After ion implantation, the resist is removed from the substrate.

A method using ashing is known as a method of removing the resist from the substrate. In the method, an ashing apparatus ashes the resist on the substrate. After that, the substrate is carried in a cleaning apparatus, and residues (polymer) of the resist, are removed from the substrate in the cleaning apparatus. The ashing is carried out by using plasma. The plasma sometimes damages a region, of the surface of the substrate, which is not covered by the resist.

In order to prevent the damage to the substrate, it is considered that the plasma ashing is performed at a mild condition and the substrate is cleaned with a stripping liquid to remove the resist after the plasma ashing. The stripping liquid is, for example, SPM (sulfuric acid/hydrogen peroxide mixture) which is a mixed liquid of sulfuric acid and hydrogen peroxide solution.

As related art, Japanese Laid Open Patent Applications JP-P2001-156049A and JP-P2002-110605A disclose cleaning of a substrate by using ozone water.

When the condition of the plasma ashing is mild, the process time of cleaning will be substantially long. For this reason, it is desired to shorten the cleaning time.

As related art, Japanese Laid Open Patent Application JP-P2004-96055A discloses supplying hot water to a surface of a substrate before removing organic matter from the surface of the substrate.

Meanwhile, a cured layer is formed in a surface of a resist when the resist is used as a mask for an ion implantation. The cured layer is hard to be stripped, thereby it take long time to strip the resist by using a stripping liquid.

Japanese Laid Open Patent Applications JP-P2004-327537A and JP-P2007-334689A disclose methods to facilitate a stripping of a resist by destroying a cured layer of the resist.

However, the present inventor recognizes that when a cured layer of a resist is physically destroyed by using the methods disclosed in Japanese Laid Open Patent Applications JP-P2004-327537A and JP-P2007-134689A, a region of a surface of a substrate, which is covered by the resist, may also be destroyed.

FIG. 1 shows a substrate 80 on which a resist 84 and gate electrodes 82 are formed. The gate electrodes 82 are structures having high aspect ratio and are not covered by the resist 84. The substrate 80 is a semiconductor wafer. The present inventor recognizes that when an impact to destroy the resist 84 is applied, the gate electrodes 82 may be destroyed.

SUMMARY

In one embodiment, a substrate processing method includes: supplying a fluid to a resist on a substrate after an ion implantation in which the resist is used as a mask; and supplying a stripping liquid to the resist for stripping the resist after the supplying the fluid. A cured layer is formed in a surface of the resist in the ion implantation. The fluid is purified water or a mixed fluid of purified water and an inert gas. A volume flow rate of the purified water is not less than $1/400$ of a volume flow rate of the inert gas when the mixed fluid is supplied as the fluid.

In another embodiment, a substrate processing apparatus includes a fluid supply unit, a stripping liquid supply unit, and a control unit. The control unit controls the fluid supply unit such that the fluid supply unit supplies a fluid to a resist on a substrate. A cured layer is formed in a surface of the resist in an ion implantation in which the resist is used as a mask. The control unit controls the stripping liquid supply unit such that the stripping liquid supply unit supplies a stripping liquid to the resist for stripping the resist after the fluid is supplied to the resist. The fluid is purified water or a mixed fluid of purified water and an inert gas. A volume flow rate of the purified water is not less than $1/400$ of a volume flow rate of the inert gas when the mixed fluid is supplied as the fluid.

According to the substrate processing method and the substrate processing apparatus, the resist can be stripped in a short time without destroying patterns formed on the substrate.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6 illustrates results of a first experimental example; and

FIG. 7 illustrates results of a second experimental example.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
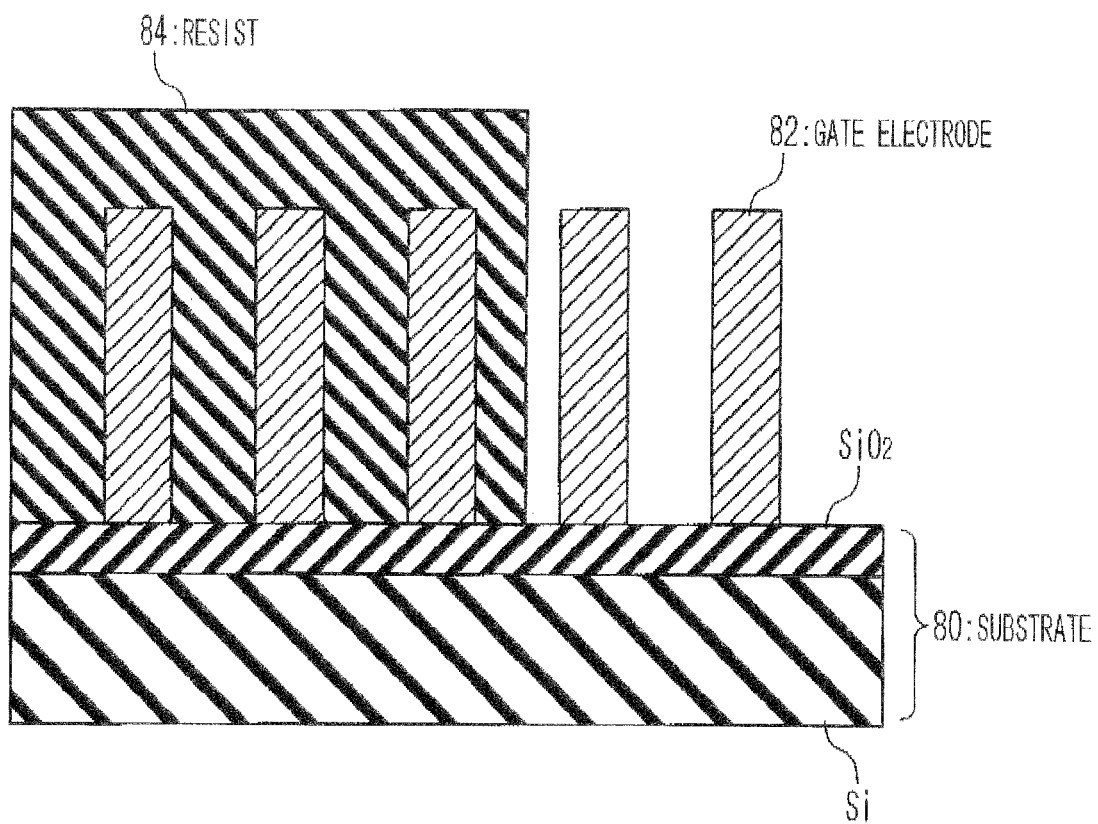
FIG. 1 is a schematic cross-sectional view of a semiconductor wafer.
Figure 2:
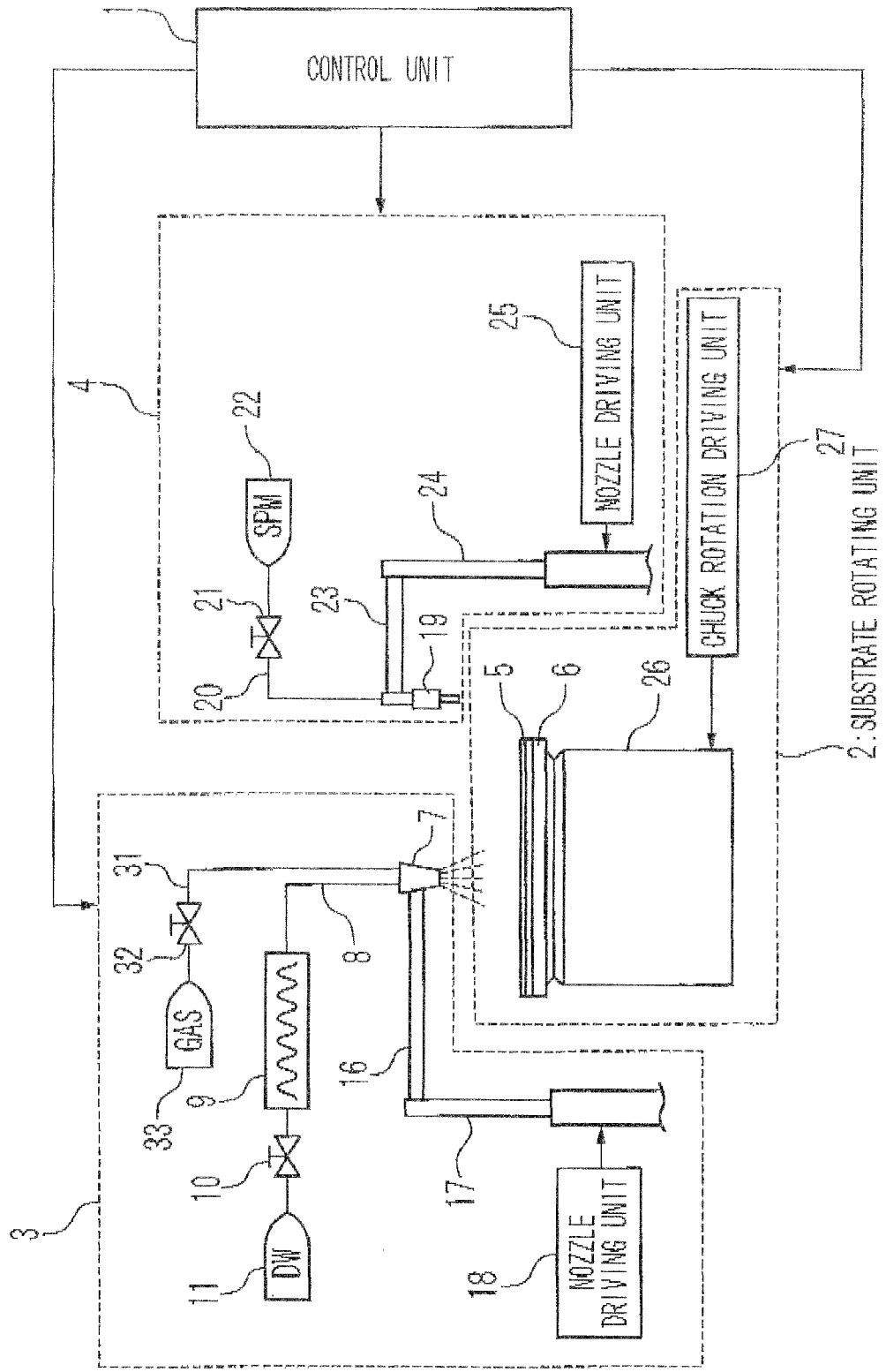
FIG. 2 is a schematic diagram of a substrate processing apparatus according to a first embodiment of the present invention.

Referring to the drawings, a substrate processing apparatus and a substrate processing method according to a first embodiment of the present invention will be described. FIG. 2 is a schematic diagram of the substrate processing apparatus according to the present embodiment.

The substrate processing apparatus includes a control unit 1, a substrate rotating unit 2, a fluid supply unit 3, and a stripping liquid supply unit 4. The control unit 1 controls the substrate rotating unit 2, the fluid supply unit 3, and the stripping liquid supply unit 4. The control unit 1 is exemplified, for example, by a computer, and implements functions to control the substrate rotating unit 2, the fluid supply unit 3, and the stripping liquid supply unit 4 based on a computer program installed in the computer in advance.

The substrate rotating unit 2 holds and rotates a substrate 6 such as a semiconductor wafer. The substrate 6 is an object to be processed. The substrate rotating unit 2 includes a spin chuck 26 and a chuck rotation driving unit 27. The spin chuck 26 holds the substrate 6. The chuck rotation driving unit 27 rotates the spin chuck 26. The chuck rotation driving unit 27 includes, for example, a motor. When the spin chuck 26 rotates, the substrate 6 held by the spin chuck 26 also rotates.

The fluid supply unit 3 supplies a fluid containing purified water to the substrate 6. The fluid supply unit 3 includes a fluid supply nozzle 7, a fluid nozzle driving unit 18, a purified water tank 11, a heater 9, and an inert gas tank 33.

The fluid supply nozzle 7 ejects the fluid to the substrate 6. The fluid supply nozzle 7 is coupled to an axis member 17 via an arm 16. The fluid nozzle driving unit 18 rotates the axis member 17. When the axis member 17 rotates, the fluid supply nozzle 7 rotates around the axis member 17. This changes a position on the substrate 6, to which the fluid is ejected.

The fluid supply nozzle 7 is connected to the purified water tank 11 via a piping 8 and to the inert gas tank 33 via a piping 31. An air operated valve 10 and the heater 9 are provided to the piping 8. When the air operated valve 10 is open, purified water such as distilled water is fed from the purified water tank 11 to the fluid supply nozzle 7. The heater 9 heats the purified water in the piping 8 to a desired temperature. A valve 32 is provided to the piping 31. When the valve 32 is open, an inert gas such as nitrogen gas and argon gas is fed from the inert gas tank 33 to the fluid supply nozzle 7. The fluid supply nozzle 7 ejects a fluid to the substrate 6. When the valve 32 is open, the fluid is (or consists of) purified water. When the valve 32 is open, the fluid is a mixed fluid of purified water and the inert gas.

The stripping liquid supply unit 4 includes a stripping liquid supply nozzle 19, a nozzle driving unit 25, and a stripping liquid tank 22. The stripping liquid supply nozzle 19 ejects stripping liquid to the substrate 6. The stripping liquid supply nozzle 19 is coupled to an axis member 24 via an arm 23. The nozzle driving unit 25 rotates the axis member 24. When the axis member 24 rotates, the stripping liquid supply nozzle 19 rotates around the axis member 24. This changes a position on the substrate 6, to which the stripping liquid is ejected.

The stripping liquid supply nozzle 19 is connected to the stripping liquid tank 22 via a piping 20. An air operated valve 21 is provided to the piping 20. Stripping liquid is stored in the stripping liquid tank 22. The stripping liquid is, for example, SPM (sulfuric acid/hydrogen, peroxide mixture) which is a mixed liquid of sulfuric acid and hydrogen peroxide solution. When the air operated valve 21 is open, the stripping liquid is fed from the stripping liquid tank 22 to the stripping liquid supply nozzle 19. The stripping liquid supply nozzle 19 ejects the stripping liquid to the substrate 6. An amount of discharge of the stripping liquid and timings of the ejection are controlled by the air operated valve 21.

The fluid supply unit 3 may not includes the piping 31, the valve 32, and the inert gas tank 33, when the fluid supply unit 3 supplies only purified water to the substrate 6.

Figure 3:
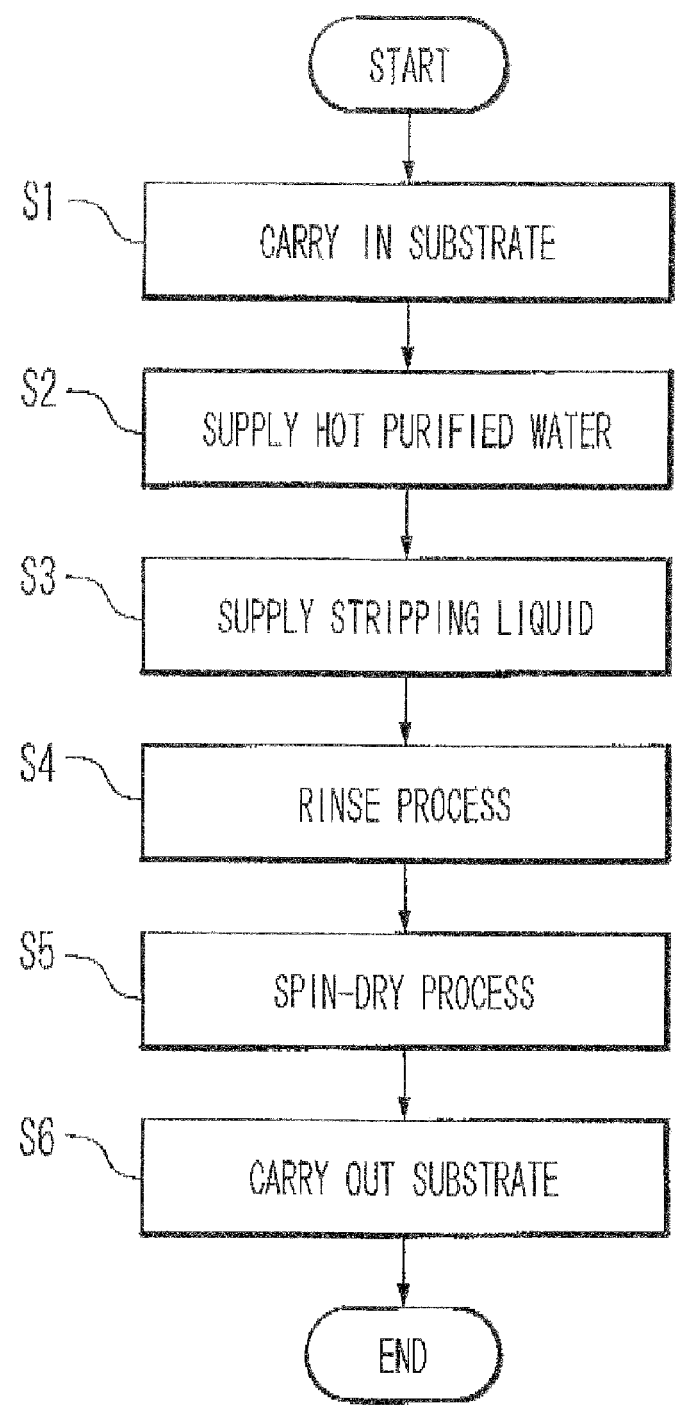
FIG. 3 is a flowchart of a substrate processing method according to the first embodiment.

The substrate processing method according to the present embodiment will be described. FIG. 3 is a flowchart of the substrate processing method. Following operations are performed based on directions by the control unit 1.

(Step S1: Carry in Substrate)

The substrate 6 on which a resist 5 is formed is carried in the substrate processing apparatus by a transfer robot (not shown) after an ion implantation is carried out to the substrate 6. A cured layer is formed in a surface of the resist 5 in the ion implantation. When a high dose of ions is implanted into the substrate 6 in the ion implantation, a short-time ashing process may be carried out to the substrate 6 before the substrate is carried in the substrate processing apparatus. The short-time ashing process means, for example, an ashing process in which ultraviolet intensity is 10 mW/cm$^2$, process temperature is 25 degrees C., and process time is 15 seconds; and means an ashing process in which the resist 5 is not removed entirely. When a low dose of ions is implanted into the substrate 6 in the ion implantation, it is preferable that no ashing is carried out to the substrate 6. The resist 5 is formed on a surface of the substrate 6. The spin chuck 26 holds the substrate 6 such that the surface of the substrate 6 faces upward, (Step S2: Supply Hot Purified Water)

Next, the chuck rotation driving unit 27 rotates the spin chuck 26. The spin chuck 26 rotates, for example, at 100 rpm. Thus, the substrate 6 rotates. While the substrate 6 rotates, the valve 10 is opened. The purified water is fed from the purified water tank 11 to the fluid supply nozzle 7. The purified water is heated by the heater and then enters the fluid supply nozzle 7. When the fluid supplied, to the substrate 6 by the fluid supply unit 3 is the purified water, the purified water is supplied in a continuous flow from the fluid supply nozzle 7 to the surface of the substrate 6.

When the fluid supplied to the substrate 6 by the fluid supply unit 3 is the mixed fluid of the purified water and the inert gas, it is preferable that a volume flow rate of the purified water is not less than $\frac{1}{400}$ of a volume flow rate of the inert gas. For example, when the volume flow rate of the inert gas is 400 L/min, the volume flow rate of the purified water is preferably not less than 1 L/min.

When the purified water is supplied to the substrate 6 or the mixed fluid is supplied to the substrate 6 such that the purified water is not less than $\frac{1}{400}$ of the inert gas in volume flow rate, the cured layer of the resist 5 swells. When the purified water is less than $\frac{1}{400}$ of the inert gas in volume flow rate, patterns formed on the substrate 6 may fall due to a strong flow of the inert gas.

Figure 4:
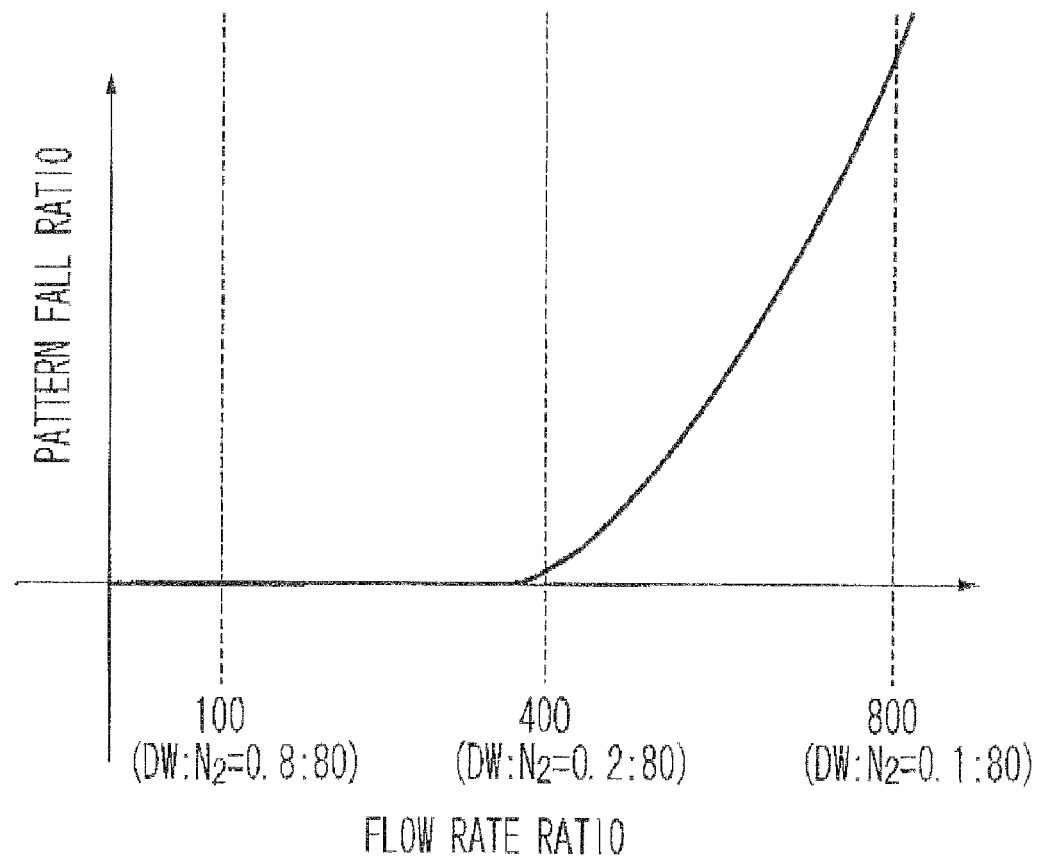
FIG. 4 is a graph showing a relationship between a pattern fall ratio and a flow rate ratio.

FIG. 4 is a graph showing a relationship between a patter fall ratio and a flow rate ratio. In FIG. 4, a horizontal axis represents the flow rate ratio. The flow rate ratio is a ratio of the volume flow rate of the inert gas to the volume flow rate of the purified water. A vertical axis represents the patter fall ratio. The pattern fall ratio is a ratio of a number of fallen patterns on the substrate 6 to a number of all patterns on the substrate 6. As shown in FIG. 4, when the flow rate ratio is greater than 400, the patterns formed on the substrate 6 may fall.

The volume flow rate of the purified water is preferably not less than 0.2 L/min and not greater than 50 L/min. In the case that the volume flow rate of the purified water is smaller than 0.2 L/min, it tabes long time to cause the cured layer to swell by supplying the purified water. Meanwhile, in the case that the volume flow rate of the purified water is greater than 50 L/min, patterns on the substrate 6 may fall depending on the type of the patterns. When the mixed fluid of the purified water and the inert gas is supplied to the substrate 6, the volume flow rate of the inert gas is preferably greater than 0 L/min and not greater than 20000 L/min because of the constraint in the volume flow rate of the purified water.

It is preferable that the purified water is supplied at a temperature not less than 50 degrees C. and not more than 100 degrees C. It is more preferable for improving the stripping of the resist that the temperature of the purified water is not less than 70 degrees C. When the mixed fluid of the purified water and the inert gas is supplied to the substrate 6, the temperature of the purified water may considerably drops immediately after the ejection from the fluid supply nozzle 7 because of the evaporation of the water. When the purified water is supplied at a low temperature to the substrate 6 because of the evaporation, it is difficult to cause the resist to swell. When the purified water is supplied at a temperature within the above-mentioned range, the purified water of relatively high temperature contacts the resist 5, and accordingly, the resist 5 certainly swells. In addition, when only the purified water is supplied to the substrate 6 or the mixed fluid is supplied to the substrate such that the volume flow rate of the purified water is not less than ¹⁄₄₀₀ of the volume flow rate of the inert gas, the temperature drop of the purified water is prevented.

When the mixed fluid or the purified water is supplied onto the substrate 6, the fluid nozzle driving unit 18 rotates the axis member 17. The axis member 17 rotates such, that the fluid supply nozzle 7 swings within a predetermined range of angle around the axis member 17. Thus, a position to which the purified water or the mixed fluid is ejected moves on the substrate 6, and the purified water or the mixed water is supplied to the entire of the surface of the substrate 6.

As described above, in the present step, by supplying the hot purified water to the resist on the substrate 6, the cured layer of the resist swells and thus is softened.

After the purified water or the mixed fluid is sufficiently supplied to the entire of the surface of the substrate 6, the valve 10 and the valve 32 are closed. Thus, the supply of the purified water or the mixed fluid is stopped After the stop of the supply, the fluid supply nozzle 7 is moved to a waiting position lateral to the spin chuck 26.

(Step S3: Supply Stripping Liquid)

Next, the stripping liquid such as SPM is supplied to the substrate 6. The stripping liquid supply nozzle 19 is moved to above the substrate 6 from a waiting position lateral to the spin chuck 26 by the nozzle driving unit 25. Then, the valve 21 is opened, and the stripping liquid is fed from the stripping liquid tank 22 to the nozzle 19. The stripping liquid of high temperature is supplied from the nozzle 19 to the surface of the rotating substrate 6. At this time, the nozzle driving unit 25 rotates the axis member 24. The axis member 24 rotates such that the nozzle 19 swings within a predetermined rage of angle around the axis member 24. Thus, a position to which the stripping liquid is ejected moves on the substrate 6, and the stripping liquid is supplied to the entire of the surface of the substrate 6.

The cured layer in the surface of the resist 5 on the substrate 6 swells and is softened in the step S2. The stripping liquid of high temperature supplied in the present step permeates inside of the resist 5 through the softened cured layer. Accordingly, the resist 5 can be stripped from the substrate 6 by the stripping liquid in a short time.

After the stripping liquid is sufficiently supplied to the entire of the surface of the substrate 6, the supply of the stripping liquid to the substrate 6 is stopped. After that, the stripping liquid supply nozzle 19 is returned to the waiting position lateral to the spin chuck 26.

(Step S4: Rinse Process)

Next, a rinse process is performed for a predetermined time. Specifically, hot purified water is supplied from the purified water tank 11 to the surface of the substrate 6 via the fluid supply nozzle 7. This flushes the stripping liquid from the surface of the substrate 6.

(Step S5: Spin-Dry Process)

After the rinse process is performed for the predetermined time, the supply of the hot purified water is stopped and a spin-dry process is performed. Specifically, the chuck, rotation driving unit 27 rotates the substrate 6 at a high rotation speed (for example, 3000 rpm). As a result, the hot purified water is removed from the substrate 6 by centrifugal force, and the substrate 6 is dried. After the finish of the spin-dry process, the chuck rotation driving unit 27 stops the rotation of the substrate 6.

(Step S6: Carry Out Substrate)

Next, the processed substrate 6 is carried out from the substrate processing apparatus by a transfer robot (not shown), and a series of the substrate processing is completed.

As described, above, according to the present embodiment, the hot purified water or the mixed fluid of the hot purified water and the inert gas is supplied to the resist. The hot purified water has a function for softening the cured layer of the resist. Accordingly, when the stripping liquid such as SPM is supplied to the resist, the stripping liquid easily permeates inside of the resist through the softened cured layer. Accordingly, the resist in which the cured layer is formed in the ion implantation can be stripped from the substrate 6 in a short time. Consequently, a throughput of the substrate processing apparatus can be improved and an amount of the stripping liquid required to process a substrate can be reduced considerably.

In addition, in the present embodiment, the surface of the substrate 6 is covered with the purified water or the mixed fluid of the purified water and the inert gas by supplying the continuous flow of the purified water or the mixed fluid to the surface of the substrate 6. During the ejected flow of the purified water or the mixed fluid is supplied to the surface of the substrate 6, the substrate 6 rotates. Thus, the purified water or the mixed fluid flows on the surface of the substrate 6 toward the outside because of the centrifugal force. Even when a portion of the resist is stripped by the ejected flow of the purified water or the mixed fluid, the stripped portion will foe removed by the centrifugal force and will not attach to the surface of the substrate 6 again.

By the wary, the case in which the substrate 6 is a semiconductor wafer has been described in the present embodiment, however, the substrate 6 is not limited to a semiconductor wafer in the present invention. For example, various substrates such as a grass substrate for a liquid crystal display device, a grass substrate for a plasma display, a grass substrate for an FED (Field Emission Display), a substrate for an optical disk, a substrate for a magnetic disk, a substrate for a magneto-optical disk, and a substrate for a photomask can be used as the substrate 6.

Second Embodiment

Figure 5:
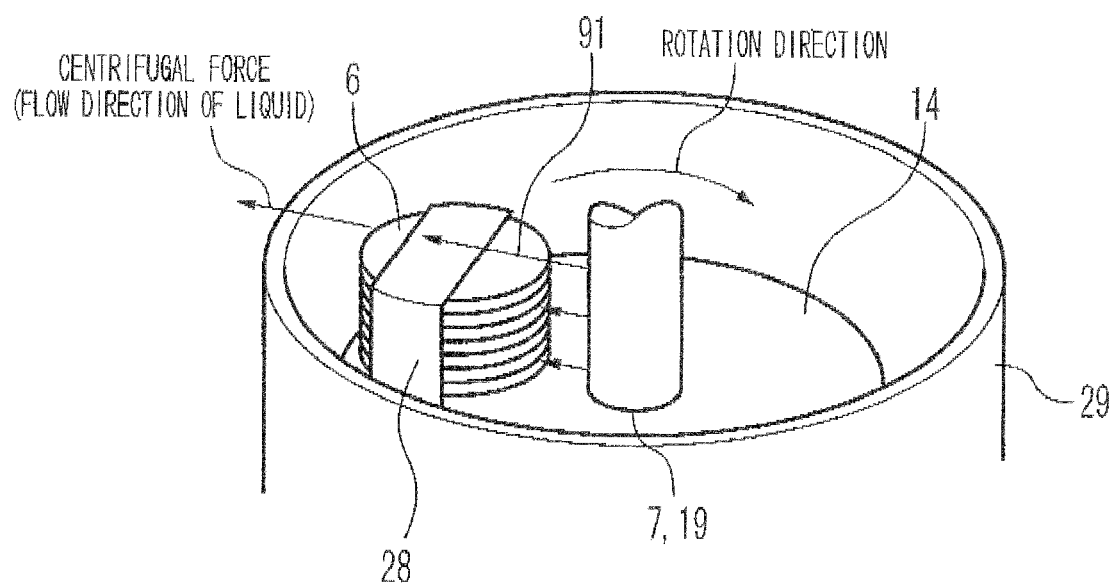
FIG. 5 is a perspective view of a portion of a substrate processing apparatus according to a second embodiment of the present invention.

FIG. 5 is a perspective view of a portion of a substrate processing apparatus according to a second embodiment of the present invention. The substrate processing apparatus according to the present embodiment is a batch type apparatus in contrast to that the substrate processing apparatus according to the first embodiment is a single-substrate apparatus. Explanations for the same points of the substrate processing apparatus according to the second embodiment as the substrate processing apparatus according to the first embodiment will be omitted.

As shown in FIG. 5, the substrate processing apparatus according to the present embodiment includes the fluid supply nozzle 7, the stripping liquid supply nozzle 19, a case 29, a rotation driving unit 14, and a substrate container 28 for containing a plurality of substrates 6. The rotation driving unit 14 may be referred to as a substrate rotating unit. The rotation driving unit 14 rotates the substrates 6. The control unit 1 (not shown in FIG. 5) controls operations of the semiconductor processing apparatus according to the present invention.

The fluid supply nozzle 7 and the stripping liquid supply nozzle 19 are arranged in a central region in the case 29. The rotation driving unit 14 rotates around the central region in the case 29. Accordingly, the substrates 6 also rotate around the central region. Though not shown in FIG. 5, the purified water tank 11 and the inert gas tank 33 are connected to the fluid supply nozzle 7 and the stripping liquid tank 22 is connected to the stripping liquid supply nozzle 19. The purified water or the mixed fluid of the purified water and the inert gas is ejected from the fluid supply nozzle 7, and the stripping liquid such as SPM is ejected from, the stripping liquid supply nozzle 19. The purified water or the mixed water is ejected in a direction indicated by an arrow 91. The stripping liquid is ejected, in the direction indicated by the arrow 91.

The operations of the substrate processing apparatus according to the present embodiment will be described.

At first, the rotation driving unit 14 rotates the substrate storage container 28 containing the plurality of substrates 6 at a predetermined rotation speed (for example, 100 rpm). The purified water or the mixed fluid of the purified water and the inert gas is supplied as a continuous flow to the surfaces of the rotating substrates 6. The surfaces of the substrates 6 are covered with the purified water. The cured layers formed in the surfaces of the substrates 6 are softened by the purified water. After the purified water or the mixed liquid is supplied for a predetermined time, the supply of the purified water or the mixed water is stopped.

Next, the stripping liquid of high temperature is supplied from the stripping liquid supply nozzle 19 to the surfaces of the rotating substrates 6. Since the cured layers in the surfaces of the substrates 6 are softened by the purified water in advance, the stripping liquid easily permeates inside the resists through softened portions of the cured layers. Consequently, the resists can be stripped from the substrates 6 in a short time. After the stripping liquid is supplied for a predetermined time, the supply of the stripping liquid to the substrates 6 is stopped.

After that, the rinse process is performed by supplying the hot purified water from the fluid supply nozzle 7 to the surfaces of the substrates 6. This flushes the stripping liquid from the surfaces of the respective substrates 6. After the rinse process is performed for a predetermined time, the supply of the hot purified water is stopped.

Subsequently, the rotation driving unit 14 rotates the substrates 6 at a high rotation speed (for example, 3000 rpm) to carry out the spin-dry process. In the spin-dry process, the purified water is removed from, the substrates 6 by centrifugal force. After the finish of the spin-dry process, the rotation driving unit 14 stops the rotation of the substrates 6.

After that, the substrates 6 are carried out from, the substrate processing apparatus by the transfer robot (not shown in FIG. 5).

As described above, according to the present embodiment, the same advantages as those of the first embodiment are provided. Furthermore, since the plurality of the substrates 6 (for example, wafers) are processed at a time, a throughput of the substrate processing apparatus can be improved considerably.

To explain the above embodiments of the present invention in detail, experimental examples will be described below.

First Experimental Example

Semiconductor wafers were prepared. A resist for KrF (krypton fluoride) excimer laser was formed on a surface of each semiconductor wafer, and patterning was performed on the resist. Ions of As (arsenic) were implanted into the surface of each semiconductor wafer at a dose amount of 8E14 atoms/cm$^2$ ($8\times10^{14}$ atoms/cm$^2$) with the resist being used as a mask. The ion-implanted wafers were used as specimens, and a stripping (removing) examination on the resist was carried out for each specimen. A stripping liquid was prepared by mixing sulfuric acid (concentration is 96 weight percent) of 80 degrees C. and hydrogen peroxide solution of 25 degrees C. at a volume ratio 2:1, and used for the stripping examinations.

Purified water (hot purified water) heated to approximately 50 degrees C. or more was supplied at 2 L/min from the fluid supply nozzle 7 to the surface of the wafer (specimen). After that, the stripping liquid was supplied at 2 L/min from the stripping liquid supply nozzle 19. Then, it was confirmed whether or not the resist was stripped from the wafer. The supply times of the purified water and the stripping water were respectively changed to observe a relationship between: the supply times of the purified water and the stripping water; and whether or not the resist was stripped from the wafer.

FIG. 6 shows examination, results of the first experimental example. In FIG. 6, a circle denotes that the resist was stripped and a cross denotes that the resist was not stripped. As shown in FIG. 6, when the purified water was not supplied (the supply time of the purified water was 0 sec), the resist was not stripped at the all supply times of the stripping liquid shown in FIG. 6. On the other hand, when the purified water was supplied, the resist was stripped by supplying the stripping water for 168 sec or more. According to the results, it was found that the stripping of the resist was considerably improved by supplying the purified water.

Second Experimental Example

Semiconductor wafer were prepared. A pattern of a resist for i-ray was formed on a surface of each semiconductor wafer. Ions of As were implanted into the surface of each semiconductor wafer at a dose amount of 2.5E14 atoms/cm$^2$ ($2.5\times10^{14}$ atoms/cm$^2$) with the resist being used as a mask. The ion-implanted wafers were used as specimens, and a stripping (removing) examination on the resist was carried out for each specimen. A stripping liquid was prepared by mixing sulfuric acid (concentration is 96 weight percent) of 80 degrees C. and hydrogen peroxide solution of 25 degrees C. at a volume ratio 2:1, and used for the stripping examinations.

Purified water (hot purified water) heated to approximately 50 degrees C. or more was supplied at 2 L/min from the fluid supply nozzle 7 to the surface of the wafer (specimen). After that, the stripping liquid was supplied at 2 L/min from the stripping liquid supply nozzle 19. Then, it was confirmed whether or not the resist was stripped from the wafer. The supply times of the purified water and the stripping water were respectively changed to observe a relationship between, the supply times of the purified water and the stripping water; and whether or not the resist was stripped from the wafer.

FIG. 7 shows examination results of the second experimental example. In FIG. 7, a circle denotes that the resist was stripped and a cross denotes that the resist was not stripped. As shown in FIG. 7, when the purified water was not supplied (the supply time of the purified water was 0 sec), the resist was not stripped at the all supply times of the stripping liquid shown in FIG. 7. On the other hand, when the purified water was supplied, it was found that the longer the supply time of the stripping liquid was, the more the resist was easily stripped. In addition, it was found that the longer the supply time of the purified water was, the more the resist was easily stripped. According to the results, if was found that the stripping of the resist was considerably improved by supplying the purified water.

It is apparent that the present invention is not limited to the above embodiments, but may be modified and changed without departing from the scope and spirit of the invention. For example, the above embodiments can be combined arbitrarily.

What is claimed is:

1. A substrate processing method comprising:
   supplying a mixed fluid of purified water and nitrogen gas to a resist on a substrate after an ion implantation in which said resist is used as a mask; and
   supplying a stripping liquid to said resist for stripping said resist after said supplying said fluid,
   wherein a cured layer is formed in a surface of said resist in said ion implantation, and
   a volume flow rate of said purified water is not less than $1/400$ of a volume flow rate of said nitrogen gas.

2. The substrate processing method according to claim 1, wherein said supplying said fluid includes supplying said purified water at a temperature of not less than 50 degrees C.

3. The substrate processing method according to claim 1, wherein said stripping liquid is SPM (sulfuric acid/hydrogen peroxide mixture).

4. The substrate processing method according to claim 1, wherein said supplying said fluid includes
   supplying said purified water at a flow rate of 1 L/min to 50 L/min.

5. The substrate processing method according to claim 1, wherein said mixed fluid is supplied to said resist on said substrate with said substrate being rotated in said supplying said fluid.

6. A substrate processing method comprising:
   supplying a mixed fluid of purified water and nitrogen gas to a resist on a substrate after an ion implantation in which said resist is used as a mask; and
   supplying a stripping liquid to said resist for stripping said resist after said supplying said fluid,
   wherein a cured layer is formed in a surface of said resist in said ion implantation, and
   a volume flow rate of said purified water is between $1/100$ and $1/400$ of a volume flow rate of said nitrogen gas.

7. The substrate processing method according to claim 6, wherein said supplying said fluid includes:
   supplying said purified water at a temperature of not less than 50 degrees C.

8. The substrate processing method according to claim 6, wherein said stripping liquid is SPM (sulfuric acid/hydrogen peroxide mixture).

9. The substrate processing method according to claim 6, wherein said supplying said fluid includes:
   supplying said purified water at a flow rate of 1 L/min to 50 L/min.

10. The substrate processing method according to claim 6, wherein said mixed fluid is supplied to said resist on said substrate with said substrate being rotated in said supplying said fluid.

\* \* \* \* \*